(12) United States Patent
Chiang et al.

(10) Patent No.: US 6,849,387 B2
(45) Date of Patent: Feb. 1, 2005

(54) METHOD FOR INTEGRATING COPPER PROCESS AND MIM CAPACITOR FOR EMBEDDED DRAM

(75) Inventors: Min-Hsiung Chiang, Taipei (TW); Chi-Hsin Lo, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 189 days.

(21) Appl. No.: 10/081,479

(22) Filed: Feb. 21, 2002

(65) Prior Publication Data

US 2003/0156378 A1 Aug. 21, 2003

(51) Int. Cl.⁷ ................. H01L 21/8242; H01L 21/8238
(52) U.S. Cl. ...................... 430/311; 430/314; 430/319; 430/329; 361/313; 257/508; 257/532; 438/241; 438/672; 438/210; 438/239; 438/636
(58) Field of Search .................. 430/311–329; 361/313; 257/508–532; 204/192.15; 438/210–672

(56) References Cited

U.S. PATENT DOCUMENTS 6,271,084 B1 * 8/2001 Tu et al. ............... 438/253
6,656,785 B2 * 12/2003 Chiang et al. ........... 438/240

* cited by examiner

*Primary Examiner*—Mark F. Huff
*Assistant Examiner*—Daborah Chacko-Davis
(74) *Attorney, Agent, or Firm*—Tung & Associates

(57) ABSTRACT

A method for integrating copper with an MIM capacitor during the formation the MIM capacitor. The MIM capacitor is generally formed upon a substrate and at least one copper layer is deposited upon the substrate and layers thereof to form at least one metal layer from which the MIM capacitor is formed, such that the MIM capacitor may be adapted for use with an embedded DRAM device. The MIM capacitor comprises a low-temperature MIM capacitor. At least one DRAM crown photo layer may be formed upon the substrate and layers thereof to form the MIM capacitor. The number of additional lithographic steps required in BEOL manufacturing operations is thus only one, while the capacitance of the MIM capacitor can be improved greatly because the sequential process of the DRAM crown photo patterning steps may be altered.

38 Claims, 4 Drawing Sheets

METHOD FOR INTEGRATING COPPER PROCESS AND MIM CAPACITOR FOR EMBEDDED DRAM

TECHNICAL FIELD

The present invention relates to a semiconductor devices and fabrication methods thereof. More specifically, the present invention relates to embedded DRAM (Dynamic Random Access Memory) devices or the like, and to a manufacturing method thereof. The present invention also relates to MIM capacitor fabrication methods and systems. The present invention also relates to methods for integrating copper with MIM capacitors utilized in embedded DRAM devices.

BACKGROUND OF THE INVENTION

In the integrated circuit (IC) industry, manufacturers are currently imbedding dynamic random access memory (DRAM) arrays on the same substrate as CPU cores or other logic devices. This technology is being referred to as embedded DRAM (eDRAM). Embedded DRAM generally can provide microcontroller (MCU) and other embedded controllers faster access to larger capacities of on-chip memory at a lower cost than that currently available using conventional embedded static random access memory (SRAM) and/or electrically erasable programmable read only memory (EEPROM).

A semiconductor memory, such as a DRAM or embedded DRAM, mainly consists of a transistor and a capacitor. Therefore, improvement in the efficiency of these two structures tends to be the direction in which technology is developing. DRAM is generally a volatile memory, and the way to store digital signals is decided by charge or discharge of the capacitor in the DRAM. When the power applied on the DRAM is turned off, the data stored in the memory cell completely disappears. A typical DRAM cell usually includes at least one field effect transistor (FET) and one capacitor. The capacitor is used to store the signals in the cell of DRAM. If more charges can be stored in the capacitor, the capacitor has less interference when the amplifier senses the data. In recent years, the memory cell of a DRAM has been miniaturized more and more from generation to generation. Even if the memory cell is minimized, a specific charge is essentially stored in the storage capacitor of the cell to store the information.

When the semiconductor enters the deep sub-micron process, the size of the device becomes smaller. For the conventional DRAM structure, this means that the space used by the capacitor becomes smaller. Since computer software is gradually becoming huge, even more memory capacity is required. In the case where it is necessary to have a smaller size with an increased capacity, the conventional method of fabricating the DRAM capacitor needs to change in order to fulfill the requirements of the trend.

There are two approaches at present for reducing the size of the capacitor while increasing its memory capacity. One way is to select a high-dielectric material, and the other is to increase the surface area of the capacitor. There are two main types of capacitor that increase capacitor area. These are the deep trench-type and the stacked-type, where digging out a trench and filling the trench with a conductive layer, a capacitive dielectric layer and a conductive layer in sequence for the capacitor form the deep trench-type capacitor.

When a dielectric material with a relatively high dielectric constant is used in a stacked capacitor, the materials for manufacturing the upper and the bottom electrodes need to be gradually replaced in order to enhance the performance of the capacitor. A structure known as a metal-insulator-metal (MIM) structure possesses a low-interfacial reaction specificity to enhance the performance of the capacitor. Therefore, it has become an important topic of research for the semiconductor capacitor in the future.

Cell areas are reduced, as a semiconductor device needs ultra-high integrity. Thus, many studies for increasing the capacitance of a capacitor are being developed. There are various ways of increasing the capacitance such as forming a stacked or trench typed three-dimensional structure, whereby a surface area of a dielectric layer is increased.

In order to constitute a cell area in a DRAM fabrication, transistors and the like are formed on a semiconductor substrate, storage and plate electrodes of polycrystalline silicon and a dielectric layer are formed wherein the dielectric layer lies between the electrodes, and metal wires are formed to connect the devices one another.

The obtainable capacitance of the storage capacitor tends to decrease dependent upon the level of the miniaturization of the storage cell. On the other hand, the necessary capacitance of the capacitor is almost constant when the storing voltage to be applied across the capacitor is fixed. Therefore, it is necessary for the capacitor to compensate the capacitance decrease due to the miniaturization by, for example, increasing the surface area of the capacitor. This surface area increase has been popularly realized by increasing the thickness of the lower electrode (or, storage electrode) of the capacitor. A typical capacitor utilized in DRAM fabrication is the Metal Insulator Metal (MIM) capacitor, which is usually located in the memory region of DRAM and embedded DRAM to increase the capacitance of the capacitor.

A capacitor is thus generally one of the most useful of passive components that is commonly integrated with active bipolar or CMOS transistors in modern VLSI devices. Integrated capacitors are commonly fabricated between polysilicon (i.e. PIP capacitors) poly to polycide/metal (i.e. MIS capacitors) or metal-to-metal (i.e. MIM) capacitors. All of these types of capacitors may be planar in nature for process compatibility and simplicity.

The MIM capacitor provides superior advantages for mixed-signal/RF applications than other PIP or MIS capacitors. An MIM capacitor is typically fabricated initially in the BEOL (back-end manufacturing) and only requires low process temperatures (i.e., less than 450 C), so that a minimum disturbance of transistor parameters is present. Additionally, MIM capacitors offer excellent linearity and symmetry due to the lack of the so-called "depletion effect," which is generally evidenced with PIP or MIS capacitors. MIM capacitors thus are fully compatible with logic processes and are preferred for modern mixed-signal or RF applications.

In present MIM formation processes and fabrication operations for embedded DRAM devices, the total number of additional lithographic steps in the BEOL (i.e., back end manufacturing process) is about 2–3, which is generally inefficient, particularly for foundry applications. As such, present MIM formation processes do not permit improvements in capacitance of MIM capacitor without additional BEOL steps. Based on the foregoing, the present inventors have concluded that a need exists to improve the capacitance of MIM capacitors and that such an improvement can be obtained by incorporating copper fabrication processes into the formation of MIM capacitors for embedded DRAM devices.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and devices thereof.

It is another aspect of the present invention to provide a method for fabricating a MIM capacitor.

It is yet another aspect of the present invention to provide a method and for fabricating an MIM (metal insulator metal) capacitor utilized in an embedded DRAM-based semiconductor device.

It is still a further aspect of the present invention to provide a method for integrating copper processes and MIM capacitors thereof in the manufacture and fabrication embedded DRAM devices.

The above and other aspects of the present invention can thus be achieved as is now described. A method for integrating copper with an MIM capacitor during the formation the MIM capacitor is disclosed herein. The MIM capacitor is generally formed upon a substrate and at least one copper layer is deposited upon the substrate and layers thereof to form at least one metal layer from which the MIM capacitor is formed, such that the MIM capacitor may be adapted for use with an embedded DRAM device. The MIM capacitor comprises a low-temperature MIM capacitor. At least one DRAM crown photo layer may be formed upon the substrate and layers thereof to form the MIM capacitor. The number of additional lithographic steps required in BEOL manufacturing operations is thus only one, while the capacitance of the MIM capacitor can be improved greatly because the sequential process of the DRAM crown photo patterning steps may be altered.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
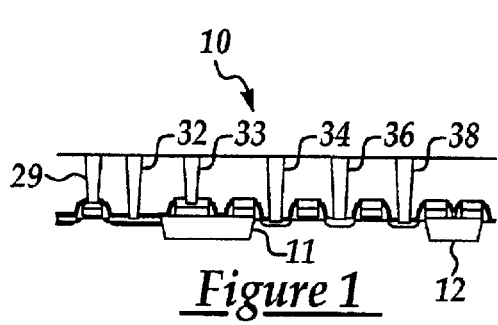
FIG. 1 depicts a first step of a semiconductor fabrication process, in accordance with a preferred embodiment of the present invention.

FIG. 1 depicts a first step 10 of a semiconductor fabrication process, in accordance with a preferred embodiment of the present invention. As indicated in first step 10, a contact and photo etching operation may be performed along with at least one W-plug (i.e., Tungsten plug) formation operation upon a substrate comprising substrate 11 and substrate 12. W-plug formations 29, 32, 33, 34, 36 and 38 are depicted in FIG. 1 positioned within an interlayer dielectric (ILD). Thereafter, as indicated in FIG. 2, a photoresist layer comprising photoresists 14, 16, 18, 19, and 22 may be formed above substrate 11 and substrate 12 and layers thereof.

Figure 2:
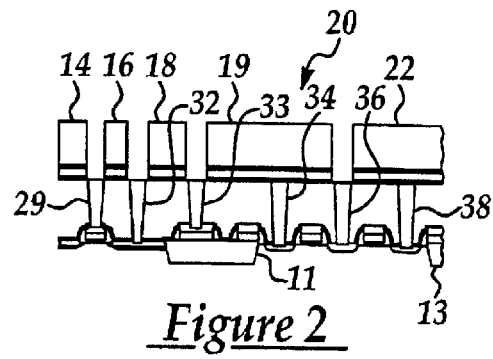
FIG. 2 illustrates a second step of a semiconductor fabrication process, in accordance with a preferred embodiment of the present invention.
Figure 3:
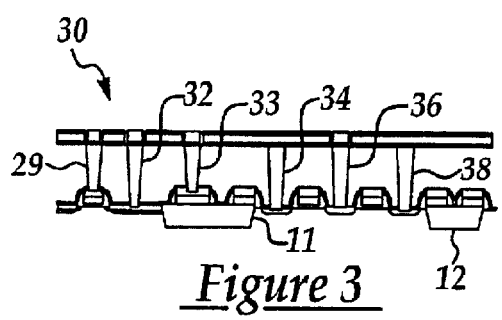
FIG. 3 depicts a third step of a semiconductor fabrication process, in accordance with a preferred embodiment of the present invention.

FIG. 2 thus illustrates a second step 20 of a semiconductor fabrication process, in accordance with a preferred embodiment of the present invention. Note that in FIGS. 1 to 16, similar parts are indicated by identical reference numerals. Second step 20 involves the deposition of an ME-1 OX (i.e., metal-1 oxide) layer through the following operational deposition procedure:

FIG. 3 depicts a third step 30 of a semiconductor fabrication process, in accordance with a preferred embodiment of the present invention. As indicated in FIG. 3, a TaN and Cu (i.e., copper) deposition layer may be formed, followed thereafter by a Cu plating operation and finally by a Cu CMP (Chemical Mechanical Processing) operation.

Figure 4:
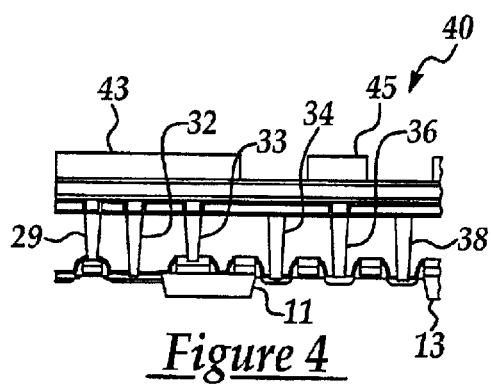
FIG. 4 illustrates a fourth step of a semiconductor fabrication process, in accordance with a preferred embodiment of the present invention.

FIG. 4 illustrates a fourth step 40 of a semiconductor fabrication process, in accordance with a preferred embodiment of the present invention. As depicted in FIG. 4, an ME2 OX-1 (metal-2 oxide-l) deposition layer may be formed according to the following deposition procedure: SiN/FSG/SiN. Thereafter, a DRAM crown photo layer may be patterned. Note that FIG. 4 indicates the presence of photoresists 43 and 45.

Figure 5:
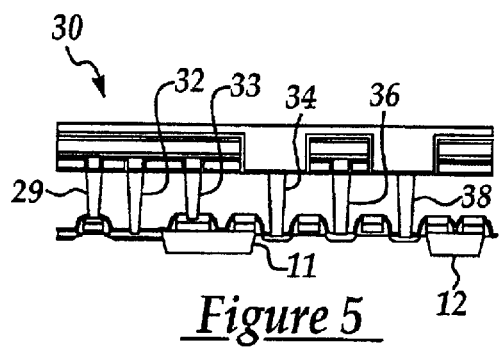
FIG. 5 depicts a fifth step of a semiconductor fabrication process, in accordance with a preferred embodiment of the present invention.

FIG. 5 depicts a fifth step 50 of a semiconductor fabrication process, in accordance with a preferred embodiment of the present invention. As depicted in FIG. 5, DRAM crown etch operation can be performed, followed by a TaN sputter operation and a PR (or BARC) coating operation to thereby form a bottom electrode of an MIM capacitor. As utilized herein, the acronym "PR" generally refers to "photoresist," and the acronym "BARC" generally refers to a type of anti-reflective coating, well known in the semiconductor fabrication arts. FIGS. 4 to 7 essentially describe a DRAM formation process, in accordance with the method hit of the present invention.

Figure 6:
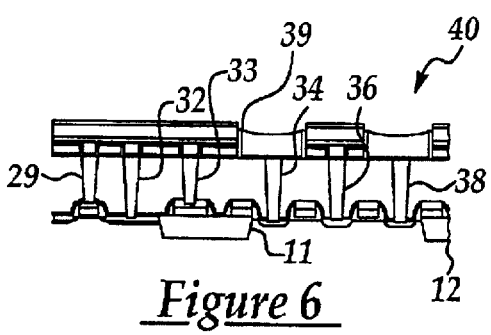
FIG. 6 illustrates a sixth step of a semiconductor fabrication process, in accordance with a preferred embodiment of ill the present invention.

FIG. 6 illustrates a sixth step 60 of a semiconductor a: fabrication process, in accordance with a preferred embodiment of the present invention. As illustrated in FIG. 6, a recess 39 can be formed to prevent electrical shortening between the bottom plate (i.e. electrode) and the top plate of the MIM capacitor formed thereof. FIG. 6 depicts a PR and TaN etch back operation.

Figure 7:
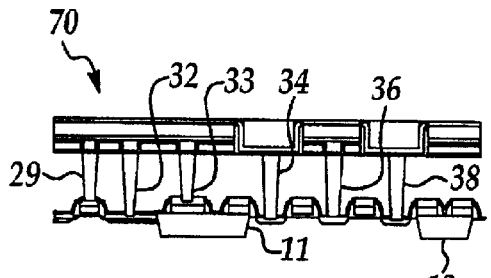
FIG. 7 depicts a seventh step of a semiconductor fabrication process, in accordance with a preferred embodiment of the present invention.
Figure 8:
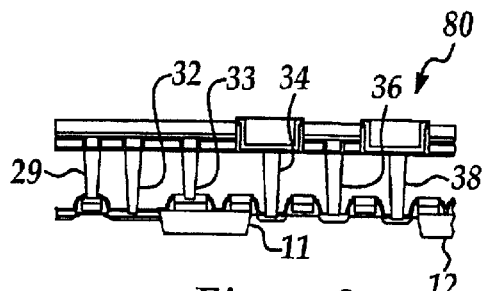
FIG. 8 illustrates an eighth step of a semiconductor fabrication process, in accordance with a preferred embodiment of the present invention.

FIG. 7 depicts a seventh step 70 of a semiconductor fabrication process, in accordance with a preferred embodiment of the present invention. As illustrated in FIG. 7, a $Ta_2O_5$/TaN/Cu seed layer may be formed, following by a copper plating operation and thereafter by a copper CMP operation. FIG. 8 illustrates an eighth step 80 of a semiconductor fabrication process, in accordance with a preferred embodiment of the present invention. As illustrated in FIG. 8, a wet etch may be performed to remove.

Figure 9:
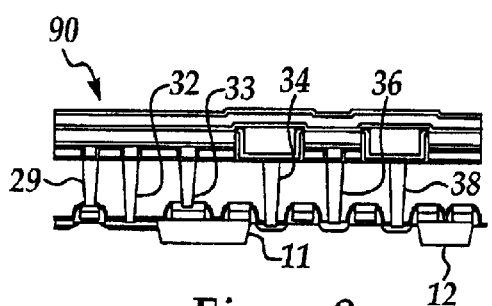
FIG. 9 depicts a ninth step of a semiconductor fabrication process, in accordance with a preferred embodiment of the present invention.
Figure 10:
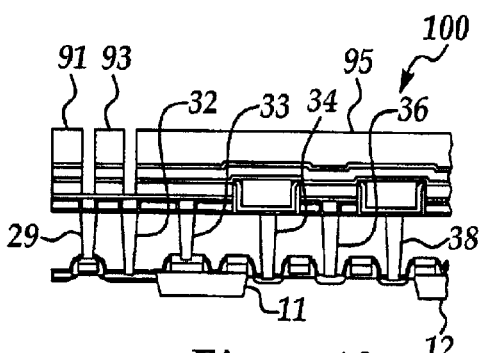
FIG. 10 illustrates a tenth step of a semiconductor fabrication process, in accordance with a preferred embodiment of the present invention.

FIG. 9 depicts a ninth step 90 of a semiconductor fabrication process, in accordance with a preferred embodiment of the present invention. As illustrated in FIG. 9, an ME2 OX2 (metal-2 oxide-2) deposition operation may be performed according to the following deposition process: (SiN/FSG/SiON). FIG. 10 illustrates a tenth step 100 of a semiconductor fabrication process, in accordance with a preferred embodiment of the present invention. As indicated in FIG. 10, a VIA-1 photo and etch operation may be performed. Note the presence of photoresists 91, 93, and 95 in FIG. 10.

Figure 11:
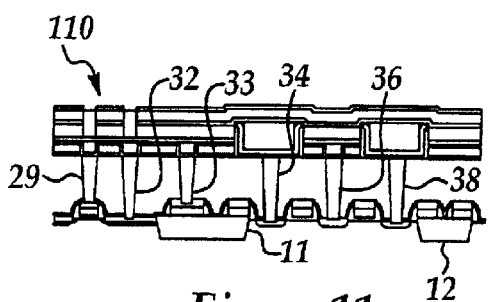
FIG. 11 depicts an eleventh step of a semiconductor fabrication process, in accordance with a preferred embodiment of the present invention.
Figure 12:
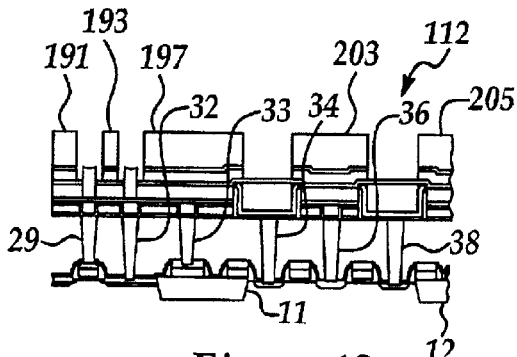
FIG. 12 illustrates a twelfth step of a semiconductor fabrication process, in accordance with a preferred embodiment of the present invention.

FIG. 11 depicts an eleventh step 110 of a semiconductor fabrication process, in accordance with a preferred embodiment of the present invention. As depicted in FIG. 11, a metal-2 I-line BARC coating operation can be processed, followed thereafter by an etch back operation. As a result of the etch back operation and BARC coating, photo resists 191, 193, 197, 203, and 205 are present, as indicated in FIG. 12. FIG. 12 thus illustrates a twelfth step 112 of a semiconductor fabrication process, in accordance with a preferred embodiment of the present invention. As indicated in FIG. 12, an ME2 OX (metal-2 oxide) photo and etch operation may be performed.

Figure 13:
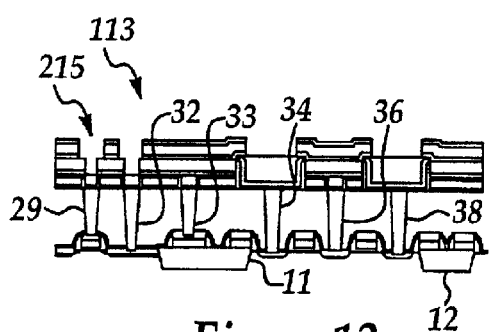
FIG. 13 depicts a thirteenth step of a semiconductor fabrication process, in accordance with a preferred embodiment of the present invention.
Figure 14:
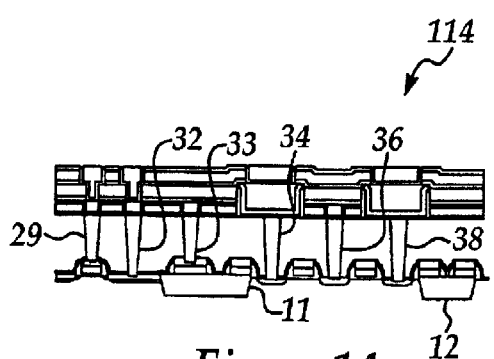
FIG. 14 illustrates a fourteenth step of a semiconductor fabrication process, in accordance with a preferred embodiment of the present invention.

FIG. 13 depicts a thirteenth step 113 of a semiconductor fabrication process, in accordance with a preferred embodiment of the present invention. As indicated in FIG. 13, a stop layer is removed. Note also the presence of a dual damascene structure in FIG. 13, indicated by reference numeral 215. FIG. 14 illustrates a fourteenth step 114 of a semiconductor fabrication process, in accordance with a preferred embodiment of the present invention. As indicated in FIG. 14, a TaN/Cu seed layer may be deposited, followed by a copper plating operation and a Cu (i.e., copper) CMP operation. A metal-2 (M2) layer is also indicated in FIG. 14.

Figure 15:
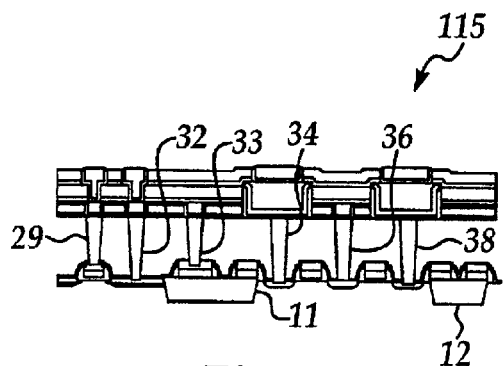
FIG. 15 depicts a fifteenth step of a semiconductor fabrication process, in accordance with a preferred embodiment of the present invention.

FIG. 15 depicts a fifteenth and final step 115 of a semiconductor fabrication process, in accordance with a preferred embodiment of the present invention. As illustrated in FIG. 15, an MIM capacitor can be formed that includes an M2 (metal-2) plate, an M1 (metal-1) bit line and M2 and M1 layers. In the configuration illustrated in FIG. 15, a cap height is indicated as 9200A. This value is, of course, an example only and may be altered, as indicated in FIG. 16.

Figure 16:
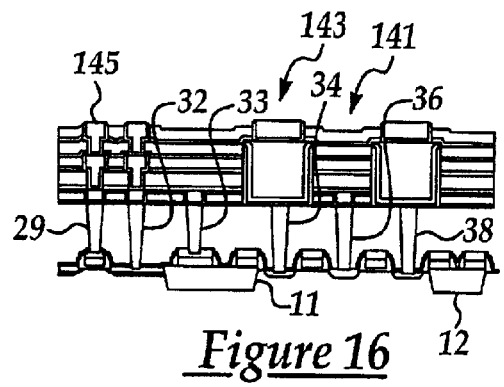
FIG. 16 illustrates a sixteenth step of a semiconductor fabrication process, in accordance with a preferred embodiment of the present invention.

FIG. 16 illustrates a sixteenth step and final 116 of a semiconductor fabrication process, in accordance with an alternative embodiment of the present invention. In the configuration illustrated in FIG. 16, the cap height is 19100A. This value can be obtained from the implementation of 4 layers of FSG. Thus, if more capacitance is required, an M3 (metal-3) layer, along with an M3 plate can be formed upon said substrate and associated layers thereof. FIGS. 15 and 16 thus illustrate the fact improvements in capacitance can be changed through sequential changes in implementing DRAM crown photo patterning.

The semiconductor fabrication operation disclosed in FIGS. 1 to 16 can thus be summarized as follows:

1. Front-end-of-line (FEOL) process to form the transistors, and then ILD contact, W-plug formation.
2. ME1OX (SiN/FSG/SiON) deposition and photo, etch patterning, followed by Ta/Cu deposition and a Cu CMP.
3. ME2OX-1 (SiN/FSG/SiON) deposition and DRAM node photo and etch.
4. TaN sputter and PR (or BARC) coating and etch back to form recess in DRAM cell node and then PR strip
5. $Ta_2O_5$/TaN/Copper deposition operation followed by, copper CMP operation and top SiN removal.
6. ME2OX-2 (SiN/FSG/SiON) deposition and then VIA-1 photo and etch
7. Metal-2 I-line BARC coating followed by an etch back operation.
8. ME2OX photo and etch operation to define logic metal-2 and DRAM top plate, followed by removal of stop layer.
9. TaN/Cu deposition and then copper CMP
10. Standard back-end-of-line (BEOL) manufacturing processes.
11. Change process sequence of DRAM crown photo patterning to improve capacitance.

FIGS. 17 to 22 depicts additional fabrication steps that can be implemented, in accordance with an alternative embodiment of the present invention. FIGS. 17 to 22 thus should be interpreted together in accordance with an alternative embodiment of the present invention. Note that in FIGS. 1 to 22 illustrated herein, analogous parts are indicated by identical reference numerals. FIGS. 17 to 22 specifically depicts a method for integrating low-K copper process with MIM capacitor fabrication techniques for embedded DRAM.

Figure 17:
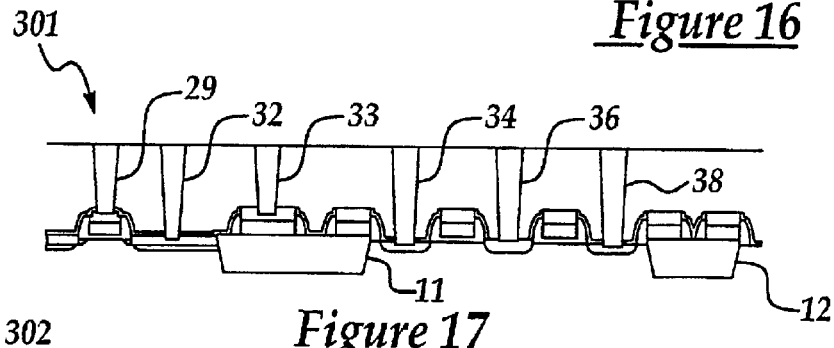
FIG. 17 depicts a first step of a semiconductor fabrication process, in accordance with an alternative embodiment of the present invention.
Figure 18:
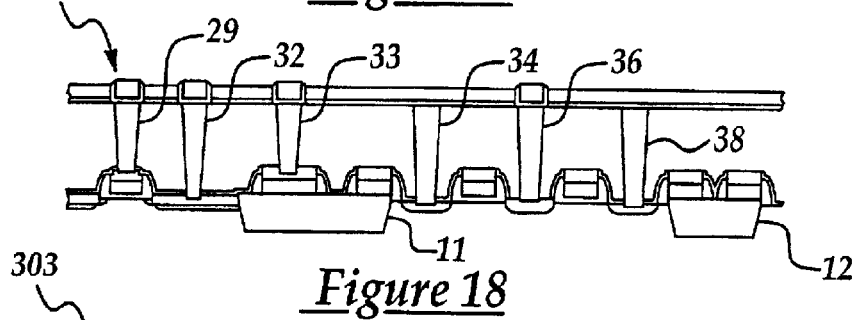
FIG. 18 illustrates a second step of a semiconductor fabrication process, in accordance with an alternative embodiment of the present invention.

FIG. 17 depicts a first step 301 of a semiconductor fabrication process, in accordance with an alternative embodiment of the present invention. As illustrated at first step 301, a FEOL process (i.e., standard BEOL process) is illustrated. FIG. 17 thus illustrates substrates 11 and 12 and plugs 29, 32, 33, 34, 36 and 38. FIG. 18 illustrates a second step 302 of a semiconductor fabrication process, in accordance with an alternative embodiment of the present invention. FIG. 18 illustrates a metal-1 layer formation fabricated according to standard BEOL processes.

Figure 19:
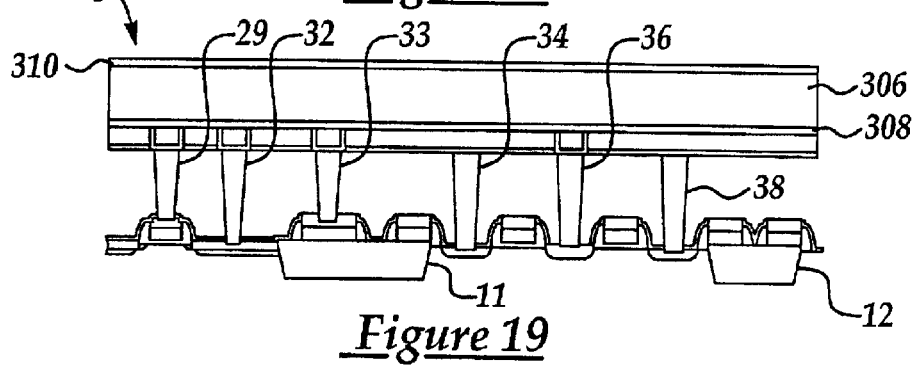
FIG. 19 depicts a third step of a semiconductor fabrication process, in accordance with an alternative embodiment of the present invention.

FIG. 19 depicts a third step 303 of a semiconductor fabrication process, in accordance with an alternative embodiment of the present invention. According to third step 303, an ME2OX (SiC/BD/SiON) deposition layer can be formed. Layer 308, for example, may be a SiC layer or alternatively, a nitride layer. Layer 306 can comprise a low K layer (BD), while layer 310 can comprise a SiON layer. Note that as utilized herein, the acronym "BD" or "B.D." refers generally to "black diamond". Thus, layer 306 comprises a black diamond layer. By choosing a low K value for layer 306, an AC delay is smaller and the resulting semiconductor device will generally attain increased speeds.

Figure 20:
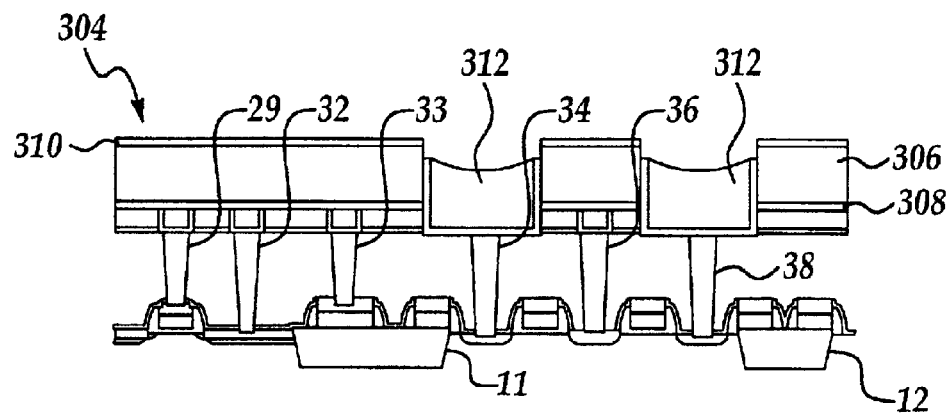
FIG. 20 illustrates a fourth step of a semiconductor fabrication process, in accordance with an alternative embodiment of the present invention.

FIG. 20 illustrates a fourth step 304 of a semiconductor fabrication process, in accordance with an alternative embodiment of the present invention. FIG. 20 illustrates a process in which a DRAM CROWN patterning operation occurs followed by a TaN deposition and photoresist (or BARC) coating. Thereafter, a PR/TaN etch back may be performed to form a TaN recess.

Figure 21:
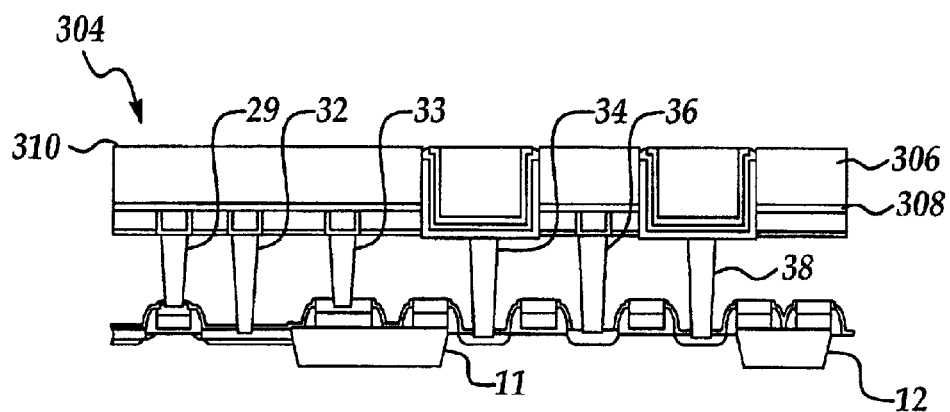
FIG. 21 depicts a fifth step of a semiconductor fabrication process, in accordance with an alternative embodiment of the present invention.

FIG. 21 depicts a fifth step 305 of a semiconductor fabrication process, in accordance with an alternative embodiment of the present invention. According to FIG. 21, a $Ta_2O_5$/TaN/Cu deposition layer may be formed, followed thereafter by the performance of a Cu CMP operation to accomplish capacitor parts.

Figure 22:
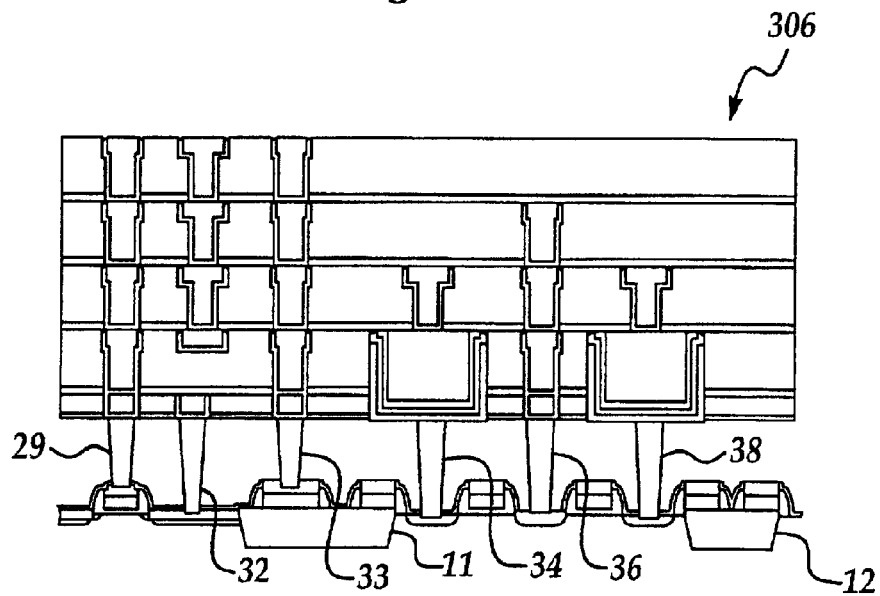
FIG. 22 illustrates a sixth step of a semiconductor a fabrication process, in accordance with an alternative embodiment of the present invention.

FIG. 22 illustrates a sixth step 306 of a semiconductor fabrication process, in accordance with an alternative embodiment of the present invention. As indicated in FIG. 22, an ME1OX and ME2OX layer can be utilized as a capacitor step height.

The semiconductor process illustrated in FIGS. 17 to 22 can thus be summarized as follows:
1. FEOL process to form the transistors, and then ILD, contact, W-plug formation.
2. ME1OX deposition and photolithography, followed by etch patterning, then a CU process to form Metal-1.
3. ME2OX-1 (SiC/BD/SiON) deposition
4. Perform a DRAM CROWN photolithography process and etch step
5. TaN deposition and photoresist (or BARC) coating, followed by etch back to form recess in DRAM CROWN region, and then a photoresist (PR) strip.
6. $Ta_2O_5$/TaN/Cu deposition followed by Cu CMP (Chemical Mechanical Polishing)
7. Repeat steps 4 to 6 to form DRAM MIM capacitor
8. ME2OX-2 (SiON) deposition followed by standard logic process to complete BEOL process
9. Utilize the thickness of ME1OX+ME2OX as MIM capacitor step height. Change the process sequence of steps 4 to 6 above subsequent to IMD layer, such as, ME1OX+ME2OX+ME3OX+ME4OX, etc., to greatly improve the capacitance.
10. The dielectric of the MIM capacitor is not limited to $Ta_2.O.$, but includes BST, PZT, etc.

Thus, according to FIGS. 17 to 21, a new method can integrate B.D. (Black Diamond) low-k copper processes for MIM capacitor fabrication of embedded DRAM devices. In prior art MIM processes for embedded DRAM, the total number of additional lithographic processing steps in the BEOL is approximately 2 to 3 which is particularly cost inefficient and expensive for foundry services. According to the alternative embodiment of the present invention illustrated in FIGS. 17 to 21, however, only one DRAM CROWN photo layer is required to form an MIM capacitor, while not impacting the associated logic process. Additionally, the capacitance can be improved greatly because the process sequence of such a DRAM CROWN photo-patterning step can be altered subsequent to the formation of the IMD layer. Thus, low temperature MIM capacitors can be efficiently integrated utilizing copper processes. This method is fully compatible with logic processes, which greatly reduces associated costs.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present is, invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for integrating copper with a MIM capacitor during the formation of said MIM capacitor, said method comprising the steps of:

forming a MIM capacitor upon a substrate for use with an embedded DRAM; and depositing at least one copper layer upon said substrate and layers thereof to form at least one metal layer from which said MIM capacitor is formed, wherein said at least one copper layer, said substrate and layers thereof are subject to a TaN sputter deposition process followed by a photoresist and coating operation for forming at least one recess within said embedded DRAM device.

2. The method of claim 1 wherein said MIM capacitor comprises a low-temperature MIM capacitor.

3. The method of claim 1 further comprising the step of: forming at least one DRAM crown photo layer upon said substrate and layers thereof to form said MIM capacitor.

4. The method of claim 1 further comprising the steps of:

forming transistors upon said substrate and layers thereof during a FEOL manufacturing operation; thereafter forming an interlayer dielectric (ILD) layer upon said substrate and layers thereof;

thereafter forming at least one contact upon said substrate and layers thereof; and then forming at least one W-plug formation upon said substrate and layers thereof.

5. The method of claim 4 further comprising the steps of:

depositing a metal-1 oxide layer upon said substrate and layers thereof through a SiN/FSG/SiN deposition operation;

performing a photo and etch patterning operation upon said substrate and layers thereof; depositing a layer comprising Ta/Cu upon said substrate and layers thereof; and performing a copper CMP operation upon said substrate and layers thereof.

6. The method of claim 5 further comprising the steps of:

depositing a metal-2 oxide-1 layer upon said substrate and layers thereof through a SIN/FSG/SIN deposition operation; and thereafter performing a DRAM node photo and etch operation upon said substrate and layers thereof.

7. The method of claim 6 further comprising the steps of:

performing a TaN sputter operation upon said substrate and layers thereof;

thereafter performing a photoresist coating and etch operation upon said substrate and layers thereof to form at least one recess in a DRAM cell node; and then performing a photoresist strip operation upon said substrate and layers thereof.

8. The method of claim 7 wherein the step of thereafter performing a photoresist coating and etch operation upon said substrate and layers thereof to form at least one recess in a DRAM cell node, further comprises the step of: thereafter performing a BARC coating and etch operation upon said substrate and layers thereof to form at least one recess in a DRAM cell node.

9. The method of claim 7 further comprising the steps of:

performing a $Ta_2O_5$/TaN/Cu deposition operation upon said substrate and layers thereof;

thereafter performing a copper CMP operation upon said substrate and layers thereof; and performing an SiN removal operation upon said substrate and layers thereof.

10. The method of claim 9 further comprising the steps of:

depositing a metal-2 oxide-2 layer through SIN/FSG/SiON deposition upon said substrate and layers thereof; and thereafter performing a VIA-1 photo and etch operation upon said substrate and layers thereof.

11. The method of claim 10 further comprising the steps of:

performing a metal-2 I-line BARC coating operation upon said substrate and layers thereof; and thereafter performing an etch back operation upon said substrate and layers thereof.

12. The method of claim 11 further comprising the steps of:

performing a metal-2 oxide photo and etch operation upon said substrate and layers thereof to define at least one logic metal-2 layer and a DRAM top plate; and thereafter removing a stop layer thereof.

13. The method of claim 12 further comprising the steps of:

performing a TaN/Cu deposition operation; and thereafter performing a copper CMP operation upon said substrate and layers thereof.

14. The method of claim 13 further comprising the steps of:

thereafter performing standard BEOL semiconductor fabrication operations to form said MIM capacitor upon said substrate.

15. The method of claim 14 further comprising step of:

varying a sequential formation of an at least one DRAM crown photo layer upon said substrate and layers thereof in order to improve an associated capacitance of said MIM capacitor.

16. The method of claim 1 further comprising the step of:

forming said MIM capacitor utilizing at least one black diamond layer, wherein said at least one black diamond layer possesses a low K value, thereby permitting an associated AC delay to be decreased, while increasing associated speeds thereof.

17. The method of claim 16 further comprising the steps of:

forming said at least one black diamond layer above a SiC layer; and forming a SiON layer above said at least one black diamond layer.

18. A MIM capacitor which integrates copper deposition during the formation of said MIM capacitor, said MIM capacitor comprising:

an MIM capacitor formed upon a substrate for use with an embedded DRAM; and at least one copper layer deposited upon said substrate and layers thereof to form at least one metal layer from which said MIM capacitor is formed, wherein said at least one copper layer, said substrate and layers thereof are subject to a TaN sputter deposition process, followed by a photoresist and coating operation for forming at least one recess within said embedded DRAM device.

19. The MIM capacitor of claim 18 wherein said MIM capacitor comprises a low-temperature MIM capacitor.

20. The MIM capacitor of claim 18 wherein at least one DRAM crown photo layer is formed upon said substrate and layers thereof to form said MIM capacitor.

21. The MIM capacitor of claim 18 further comprising:

at least one transistor formed upon said substrate and layers thereof during a FEOL manufacturing operation;

an interlayer dielectric (ILD) layer formed upon said substrate and layers thereof;

at least one contact formed upon said substrate and layers thereof; and at least one W-plug formation formed upon said substrate and layers thereof.

22. The MIM capacitor of claim 21 further comprising:

a metal-1 oxide layer deposited upon said substrate and layers thereof through a SIN/FSG/SIN deposition operation, wherein a photo and etch patterning operation is thereafter upon said substrate and layers thereof; and a layer comprising Ta/Cu formed upon said substrate and layers thereof, wherein a copper CMP operation is subsequently performed upon said substrate and layers thereof.

23. The MIM capacitor of claim 22 further comprising:

a metal-2 oxide-1 layer deposited upon said substrate and layers thereof through a SiN/FSG/SiN deposition operation, wherein a DRAM node photo and etch operation is thereafter performed upon said substrate and layers thereof.

24. The MIM capacitor of claim 23 wherein said substrate and layers thereof are subject to a TaN sputter operation followed by a photoresist coating and etch operation to form at least one recess in a DRAM cell node; and wherein a photoresist strip operation is thereafter performed upon said substrate and layers thereof.

25. The MIM capacitor of claim 24 wherein a BARC coating and etch operation is performed upon said substrate and layers thereof to form at least one recess in a DRAM cell node.

26. The MIM capacitor of claim 24 wherein said substrate and layers are subject to $Ta_2O_5$/TaN/Cu deposition operation followed by the performance of a copper CMP operation and a SiN removal operation upon said substrate and layers thereof.

27. The MIM capacitor of claim 26 further comprising: a metal-2 oxide 2 layer deposited through SiN/FSG/SiON deposition upon said substrate and layers thereof, wherein a VIA-1 photo and etch operation is thereafter performed upon said substrate and layers thereof.

28. The MIM capacitor of claim 27 wherein said substrate and layers thereof are subject to a metal-2 I-line BARC coating operation and thereafter to an etch back operation.

29. The MIM capacitor of claim 28 wherein said substrate and layers thereof are subject to a metal-2 oxide photo and etch operation to define at least one logic metal-2 layer and a DRAM top plate, such that a stop layer thereof is thereafter removed.

30. The MIM capacitor of claim 29 wherein said substrate and layers thereof are subject to a TaN/Cu deposition operation and a performance of a copper CMP operation.

31. The MIM capacitor of claim 30 wherein said substrate and layers thereof are subject to the performance of standard BEOL semiconductor fabrication operations to form said MIM capacitor upon said substrate.

32. The MIM capacitor of claim 31 wherein sequential formation of an at least one DRAM crown photo layer upon said substrate and layers thereof can be varied in order to improve an associated capacitance of said MIM capacitor.

33. The MIM capacitor of claim 18 further comprising:
at least one black diamond layer, wherein said at least one black diamond layer possesses a low K value, thereby permitting an associated AC delay to be decreased, while increasing associated speeds thereof.

34. The MIM capacitor of claim 33 further comprising: said at least one black diamond layer located above a SiC layer; and a SiON layer located above said at least one black diamond layer.

35. A method for integrating copper with a MIM capacitor during the formation said MIM capacitor, of said method comprising the steps of:
forming a MIM capacitor upon a substrate;
depositing at least one copper layer upon said substrate and layers thereof to form at least one metal layer from which said MIM capacitor is formed, such that said MIM capacitor may be adapted for use with an embedded DRAM device;
forming transistors upon said substrate and layers thereof during a FEOL manufacturing operation; thereafter forming an interlayer dielectric (ILD) layer upon said substrate and layers thereof;
thereafter forming at least one contact upon said substrate and layers thereof;
then forming at least one W-plug formation upon said substrate and layers thereof;
depositing a metal-1 oxide layer upon said substrate and layers thereof through a SiN/FSG/SIN deposition operation;
performing a photo and etch patterning operation upon said substrate and layers thereof; depositing a layer comprising Ta/Cu upon said substrate and layers thereof;
performing a copper CMP operation upon said substrate and layers thereof;
depositing a metal-2 oxide-1 layer upon said substrate and layers thereof through a SiN/FSG/SiN deposition operation;
thereafter performing a DRAM node photo and etch operation upon said substrate and layers thereof;
performing a TaN sputter operation upon said substrate and layers thereof;
thereafter performing a photoresist coating and etch operation upon said substrate and layers thereof to form at least one recess in a DRAM cell node; and
then performing a photoresist strip operation upon said substrate and layers thereof; and
thereafter performing a BARC coating and etch operation upon said substrate and layers thereof to form at least one recess in a DRAM cell node.

36. A method for integrating copper with a MIM capacitor during the formation of said MIM capacitor, said method comprising the steps of:
forming a MIM capacitor upon a substrate;
depositing at least one copper layer upon said substrate and layers thereof to form at least one metal layer from which said MIM capacitor is formed, such that said MIM capacitor may be adapted for use with an embedded DRAM device;
forming transistors upon said substrate and layers thereof during a FEOL manufacturing operation; thereafter forming an interlayer dielectric (ILD) layer upon said substrate and layers thereof;
thereafter forming at least one contact upon said substrate and layers thereof;
then forming at least one W-plug formation upon said substrate and layers thereof;
depositing a metal-1 oxide layer upon said substrate and layers thereof through a SiN/FSG/SiN deposition operation;
performing a photo and etch patterning operation upon said substrate and layers thereof; depositing a layer comprising Ta/Cu upon said substrate and layers thereof;
performing a copper CMP operation upon said substrate and layers thereof;
depositing a metal-2 oxide-1 layer upon said substrate and layers thereof through a SiN/FSG/SiN deposition operation;
thereafter performing a DRAM node photo and etch operation upon said substrate and layers thereof;
performing a TaN sputter operation upon said substrate and layers thereof;
thereafter performing a photoresist coating and etch operation upon said substrate and layers thereof to form at least one recess in a DRAM cell node; and
then performing a photoresist strip operation upon said substrate and layers thereof;
performing a $Ta_2O_5$/TaN/Cu deposition operation upon said substrate and layers thereof;
thereafter performing a copper CMP operation upon said substrate and layers thereof; and performing an SiN removal operation upon said substrate and layers thereof;

depositing a metal-2 oxide 2 layer through SiN/FSG/SiON deposition upon said substrate and layers thereof;

thereafter performing a VIA-1 photo and etch operation upon said substrate and layers thereof;

performing a metal-2 I-line BARC coating operation upon said substrate and layers thereof;

thereafter performing an etch back operation upon said substrate and layers thereof;

performing a metal-2 oxide photo and etch operation upon said substrate and layers thereof to define at least one logic metal-2 layer and a DRAM top plate;

thereafter removing a stop layer thereof;

performing a TaN/Cu deposition operation;

thereafter performing a copper CMP operation upon said substrate and layers thereof;

thereafter performing standard BEOL semiconductor fabrication operations to form said MIM capacitor upon said substrate; and varying a sequential formation of an at least one DRAM crown photo layer upon said substrate and layers thereof in order to improve an associated capacitance of said MIM capacitor.

37. A MIM capacitor which integrates copper deposition during the formation of said MIM capacitor, said MIM capacitor comprising:

a MIM capacitor formed upon a substrate; and at least one copper layer deposited upon said substrate and layers thereof to form at least one metal layer from which said MIM capacitor is formed, such that said MIM capacitor may be adapted for use with an embedded DRAM device;

at least one transistor formed upon said substrate and layers thereof during a FEOL manufacturing operation;

an interlayer dielectric (ILD) layer formed upon said substrate and layers thereof;

at least one contact formed upon said substrate and layers thereof;

at least one W-plug formation formed upon said substrate and layers thereof;

a metal-1 oxide layer deposited upon said substrate and layers thereof through a SiN/FSG/SiN deposition operation, wherein a photo and etch patterning operation is thereafter performed upon said substrate and layers thereof;

a layer comprising Ta/Cu formed upon said substrate and layers thereof, wherein a copper CMP operation is subsequently performed upon said substrate and layers thereof;

a metal-2 oxide-1 layer deposited upon said substrate and layers thereof through a SiN/FSG/SiN deposition operation, wherein a DRAM node photo and etch operation is thereafter performed upon said substrate and layers thereof;

wherein said substrate and layers thereof are subject to a TaN sputter operation followed by a photoresist coating and etch operation to form at least one recess in a DRAM cell node; and wherein a photoresist strip operation is thereafter performed upon said substrate and layers thereof; and wherein a BARC coating and etch operation is performed upon said substrate and layers thereof to form at least one recess in a DRAM cell node.

38. A MIM capacitor which integrates copper deposition during the formation of said MIM capacitor, said MIM capacitor comprising:

a MIM capacitor formed upon a substrate;

at least one copper layer deposited upon said substrate and layers thereof to form at least one metal layer from which said MIM capacitor is formed, such that said MIM capacitor may be adapted for use with an embedded DRAM device;

at least one transistor formed upon said substrate and layers thereof during a FEOL manufacturing operation;

an interlayer dielectric (ILD) layer formed upon said substrate and layers thereof;

at least one contact formed upon said substrate and layers thereof;

at least one W-plug formation formed upon said substrate and layers thereof;

a metal-1 oxide layer deposited upon said substrate and layers thereof through a SiN/FSG/SiN deposition operation, wherein a photo and etch patterning operation is thereafter performed upon said substrate and layers thereof;

a layer comprising Ta/Cu formed upon said, substrate and layers thereof, wherein a copper CMP operation is subsequently performed upon said substrate and layers thereof;

a metal-2 oxide-1 layer deposited upon said substrate and layers thereof through a SiN/FSG/SiN deposition operation, wherein a DRAM node photo and etch operation is thereafter performed upon said substrate and layers thereof;

wherein said substrate and layers are subject to $Ta_2O_5$/TaN/Cu deposition operation followed by the performance of a copper CMP operation and an SiN removal operation upon said substrate and layers thereof;

a metal-2 oxide 2 layer deposited through SiN/FSG/SiON deposition upon said substrate and layers thereof, wherein a VIA-1 photo and etch operation is thereafter, upon said substrate and layers thereof;

wherein said substrate and layers thereof are subject to a metal-2 I-line BARC coating operation and thereafter to an etch back operation;

wherein said substrate and layers thereof are subject to a metal-2 oxide photo and etch operation to define at least one logic metal-2 layer and a DRAM top plate, such that a stop layer thereof is thereafter removed;

wherein said substrate and layers thereof are subject to a TaN/Cu deposition operation and a performance of a copper CMP operation;

wherein said substrate and layers thereof are subject to the performance of standard BEOL semiconductor fabrication operations to form said MIM capacitor upon said substrate; and wherein sequential formation of said at least one DRAM crown photo layer upon said substrate and layers thereof can be varied in order to improve an associated capacitance of said MIM capacitor.

* * * * *